(12) United States Patent
Südow et al.

(10) Patent No.: US 8,754,649 B2
(45) Date of Patent: Jun. 17, 2014

(54) ELECTROMAGNETIC SURVEY SYSTEMS AND METHODS WITH ROTATION-CORRECTED MOTION COMPENSATION

(75) Inventors: Gustav Göran Mattias Südow, Vällingby (SE); Ulf Peter Lindqvist, Segeltorp (SE); Andras Robert Juhasz, Hägersten (SE); Carl Joel Gustav Skogman, Hägersten (SE)

(73) Assignee: PGS Geophysical AS, Lysaker (NO)

( * ) Notice: Subject to any disclaimer, the term of this patent is extended or adjusted under 35 U.S.C. 154(b) by 650 days.

(21) Appl. No.: 12/800,276

(22) Filed: May 12, 2010

(65) Prior Publication Data
US 2011/0279120 A1    Nov. 17, 2011

(51) Int. Cl.
*G01R 33/025* (2006.01)
*G01S 11/00* (2006.01)

(52) U.S. Cl.
USPC ........................................................ 324/334

(58) Field of Classification Search
CPC ..... G01V 1/3835; G01R 33/025; G01S 11/00
USPC ........................................................ 324/334
See application file for complete search history.

(56) References Cited

U.S. PATENT DOCUMENTS

| | | | |
|---|---|---|---|
| 3,397,358 A | 8/1968 | Allenden et al. | |
| 4,617,518 A | 10/1986 | Srnka | |
| 5,170,566 A | 12/1992 | Fowler et al. | |
| 6,842,006 B2 | 1/2005 | Conti et al. | |
| 7,671,598 B2 | 3/2010 | Ronaess et al. | |
| 8,230,801 B2 * | 7/2012 | Hillesund et al. | 114/246 |
| 8,278,929 B2 * | 10/2012 | Summerfield et al. | 324/334 |
| 2005/0194201 A1 | 9/2005 | Tenghamn et al. | |
| 2008/0253225 A1 | 10/2008 | Welker et al. | |
| 2011/0210741 A1 | 9/2011 | Südow et al. | |
| 2012/0002504 A1 * | 1/2012 | Muyzert et al. | 367/21 |

OTHER PUBLICATIONS

Parnum, "Underwater measurements of magnetic field", J. Electrical Engineers, V. 93, No. 70, Part 1, 1946, p. 435-446.*

* cited by examiner

*Primary Examiner* — Thomas F Valone

(57) ABSTRACT

A disclosed electromagnetic survey system includes one or more streamer(s) having multiple electromagnetic sensors and motion sensing units. Each motion sensing unit has one or more accelerometer(s) to measure motion perpendicular to an axis of the streamer, and a rotation sensor to measure rotation about the axis. The measurements of the accelerometer are adjusted based on measurements from the rotation sensor. The survey system also includes one or more processor(s) that determine, for each electromagnetic sensor, a motion signal based on the adjusted measurements. A described electromagnetic survey method includes processing acceleration and rotational motion measurements to obtain an orientation of motion sensing units as a function of time. The measured acceleration is manipulated based on the orientation to obtain one or more velocity signal(s) for each motion sensing unit. Interpolation is performed on the velocity signals to determine at least one velocity signal for each electromagnetic sensor.

22 Claims, 6 Drawing Sheets

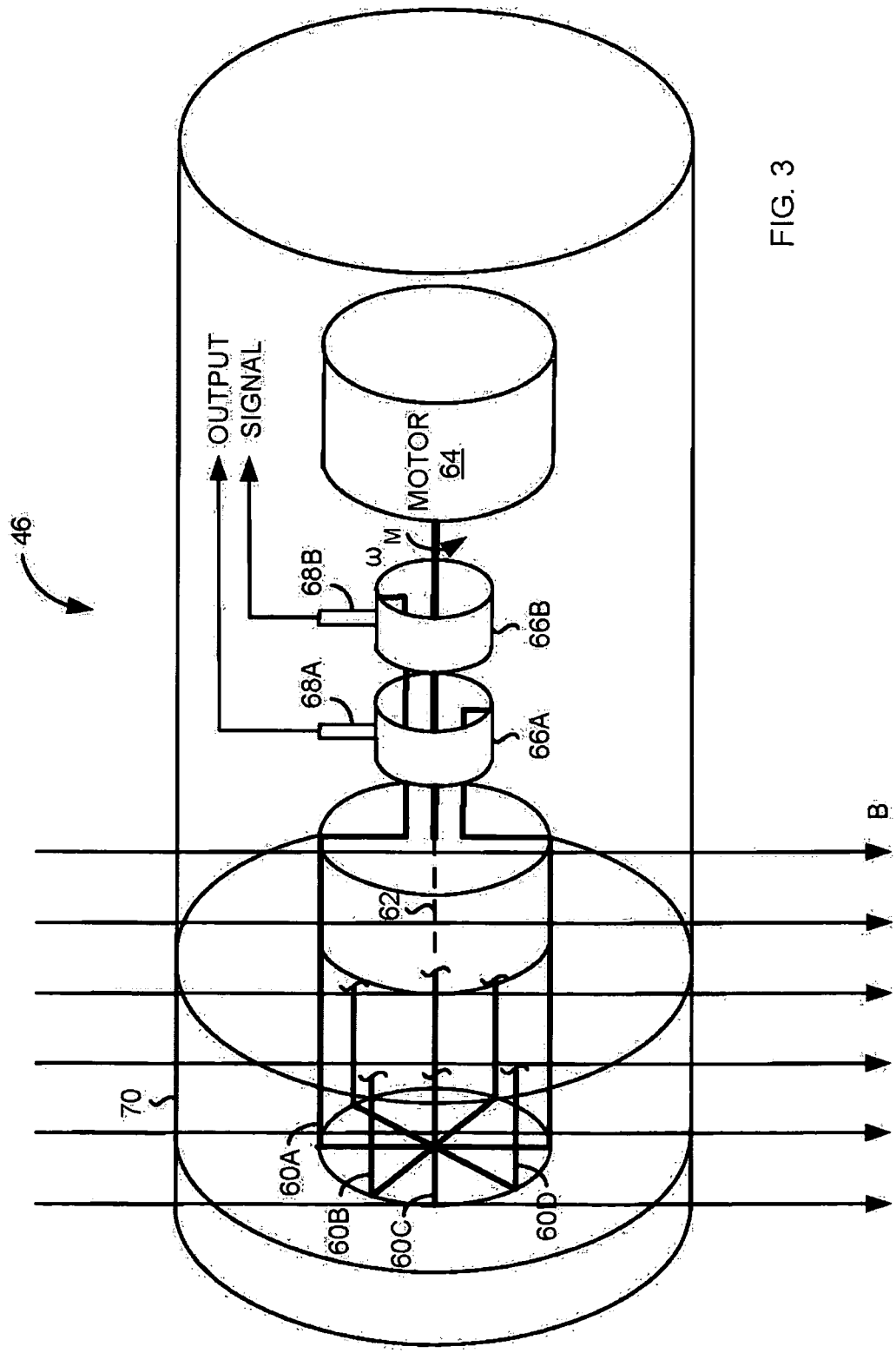

ELECTROMAGNETIC SURVEY SYSTEMS AND METHODS WITH ROTATION-CORRECTED MOTION COMPENSATION

BACKGROUND

Electromagnetic geophysical surveying of the earth's subsurface includes "controlled source" and "natural source" electromagnetic surveying. Controlled source electromagnetic (CSEM) surveying typically includes imparting an electric field or a magnetic field into subsurface earth formations and measuring resultant changes in electric and/or magnetic fields. For example, resultant changes in electric fields can be determined by measuring voltage differences induced in electrodes or antennas, and magnetometers can be used to measure resultant changes in magnetic fields. Recordings of the induced electric and/or magnetic fields are then used to make inferences about the spatial distribution of conductivity of the earth's subsurface.

Solar energy and lightning cause natural variations in the earth's magnetic field, thereby inducing electric currents (known as telluric currents) under the earth's surface. In a marine environment, natural source (e.g., magneto-telluric or MT) electromagnetic surveying typically includes deploying multi-component ocean bottom receiver stations. Simultaneous measurements of orthogonal components of the electric and magnetic fields are recorded, and the results are used to create a subsurface resistivity model.

CSEM surveying typically includes imparting a substantially continuous, time varying electromagnetic field into subsurface formations. In frequency domain controlled source electromagnetic (f-CSEM) surveying, a time varying electric current is passed through a transmitter antenna, where the current includes one or more selected discrete frequencies. In another technique known as transient controlled source electromagnetic surveying (t-CSEM), electric current is passed through a transmitter at the earth's surface (or near the sea floor) in a manner similar to f-CSEM. The electric current may be direct current (DC). At a selected time, a transient is introduced, typically by switching the electric current on or off, or by reversing its direction. Induced voltages and/or magnetic fields are measured at the earth's surface (or at the surface of a body of water), typically with respect to time over a selected time interval. Alternative switching techniques are possible. Structure of the subsurface is inferred by the time distribution of the induced voltages and/or magnetic fields.

The above described methods for f-CSEM and t-CSEM have been adapted for use in marine environments. Cable-based sensors have been devised for detecting electric and/or magnetic field signals resulting from imparting electric and/or magnetic fields into formations below the bottom of a body of water. Electromagnetic survey systems in which receivers are towed in the water behind a survey vessel, analogous to marine seismic surveys, are desirable as surveys with towed receivers are more efficient that those in which receivers are deployed on a bottom surface of a body of water, and later retrieved after part of the subsurface is surveyed.

A problem arises in towed electromagnetic survey systems in that unavoidable movements of receiver system components result in noise voltages being introduced into conductors carrying voltage signals. For example, pairs of electrodes detecting electric fields produce small voltage signals, sometimes on the order of fractions of a nanovolt. Noise voltages deleteriously impact such small voltage signals, and, if the noise voltages are large enough, can make it impracticable to produce accurate measurements based on the small voltage signals.

SUMMARY

The problems outlined above are at least in part addressed by electromagnetic survey systems and methods having rotation-corrected motion compensation. A disclosed electromagnetic survey system includes one or more streamer(s) having multiple electromagnetic sensors and multiple motion sensing units. Each motion sensing unit has one or more accelerometer(s) to measure motion perpendicular to an axis of the streamer, and a rotation sensor to measure rotation about the axis. The measurements of the accelerometer are adjusted based at least in part on measurements from the rotation sensor. The survey system also includes one or more processor(s) that determine, for each electromagnetic sensor, a motion signal based at least in part on the adjusted measurements.

The motion signal may represent a velocity of that electromagnetic sensor perpendicular to the axis. Each electromagnetic sensor may include one of the motion sensing units, or alternatively the motion sensing units can be located at selected points along the length of the streamer. In the latter case, the processor(s) may determine at least some of the motion signals by interpolating between motion sensing units. The survey system may also include an information storage medium that stores measurements of the electromagnetic sensors, and information sufficient to determine the motion signals.

The processor(s) may determine an error signal for each electromagnetic sensor based at least in part on the motion signal, and use that error signal to correct the measurements of that electromagnet sensor. The information storage medium may also store measurements of the electromagnetic sensors that have been corrected for motion-induced voltages.

The rotation sensor may include a rotating coil magnetometer. The rotating coil magnetometer may have multiple windings to provide multiple signals that are at different phase offsets from one another. The rotating coil magnetometer may provide a magnetic field strength measurement that is used to determine motion-induced voltages for each electromagnetic sensor.

Each motion sensing unit may determine a base orientation from measurements of the accelerometer, and may determine a current orientation by combining the base orientation with a processed angular velocity signal from the rotation sensor. Each motion sensing unit may rotate the accelerometer measurements to an external reference frame based on the current orientation, and wherein the motion sensing unit further corrects the rotated measurements for gravity.

A described electromagnetic survey method includes measuring acceleration at multiple positions along the towed marine streamer. A rotating coil magnetometer is used to determine rotational motion of each motion sensing unit used to measure the acceleration. The acceleration and rotational motion measurements are processed to obtain an orientation of each motion sensing unit as a function of time. The measured acceleration is manipulated based on the orientation to obtain one or more velocity signal(s) for each motion sensing unit. If necessary, interpolation is performed on the velocity signals from the motion sensing units to determine at least one velocity signal for each electromagnetic sensor. Measurements of the electromagnetic sensors are corrected based at least in part on the corresponding velocity signal(s). The corrected electromagnetic sensor measurements are recorded on an information storage medium.

The correcting of the measurements may be based on a magnetic field strength measured by the rotating coil magnetometer. The correcting of the measurements may include determining a voltage signal induced in each of the electromagnetic sensors by their motion through a magnetic field.

The manipulating of the measured acceleration may include rotating multi-axial accelerometer measurements from a coordinate system of the motion sensing unit to an external coordinate system, and subtracting gravity from a vertical component of the rotated measurements to obtain estimated acceleration components. The manipulating may also include processing the estimated acceleration components to obtain velocity component signals.

A described motion sensing system for a towed marine streamer includes a tri-axial accelerometer, a magnetometer, and a signal processor. The tri-axial accelerometer is positioned on a streamer axis, and one component of the accelerometer is aligned along the streamer axis. The magnetometer has at least one coil that rotates about an axis of symmetry contained in a plane that includes the coil, the axis being aligned along the streamer axis. The signal processor demodulates a signal from the magnetometer to determine a magnetic field strength and an angular velocity signal representing rotational motion of the motion sensing unit about the streamer axis. The signal processor combines accelerometer measurements with the magnetometer measurements to produce output signals representing components of the unit's motion in an external frame of reference.

The external frame of reference may be defined by a three-axis coordinate system having one axis aligned with the streamer axis, one axis aligned with gravity, and the third axis perpendicular to the first two. The output signals produced by the signal processor may represent acceleration components or velocity components.

BRIEF DESCRIPTION OF THE DRAWINGS

A better understanding of the various disclosed embodiments can be obtained when the detailed description is considered in conjunction with the following drawings, in which:

FIG. 3 is a perspective view of one embodiment of a rotation sensor of the motion sensing unit of the sensor pod of FIG. 2, where the rotation sensor is a rotating coil magnetometer;

Figure 1:
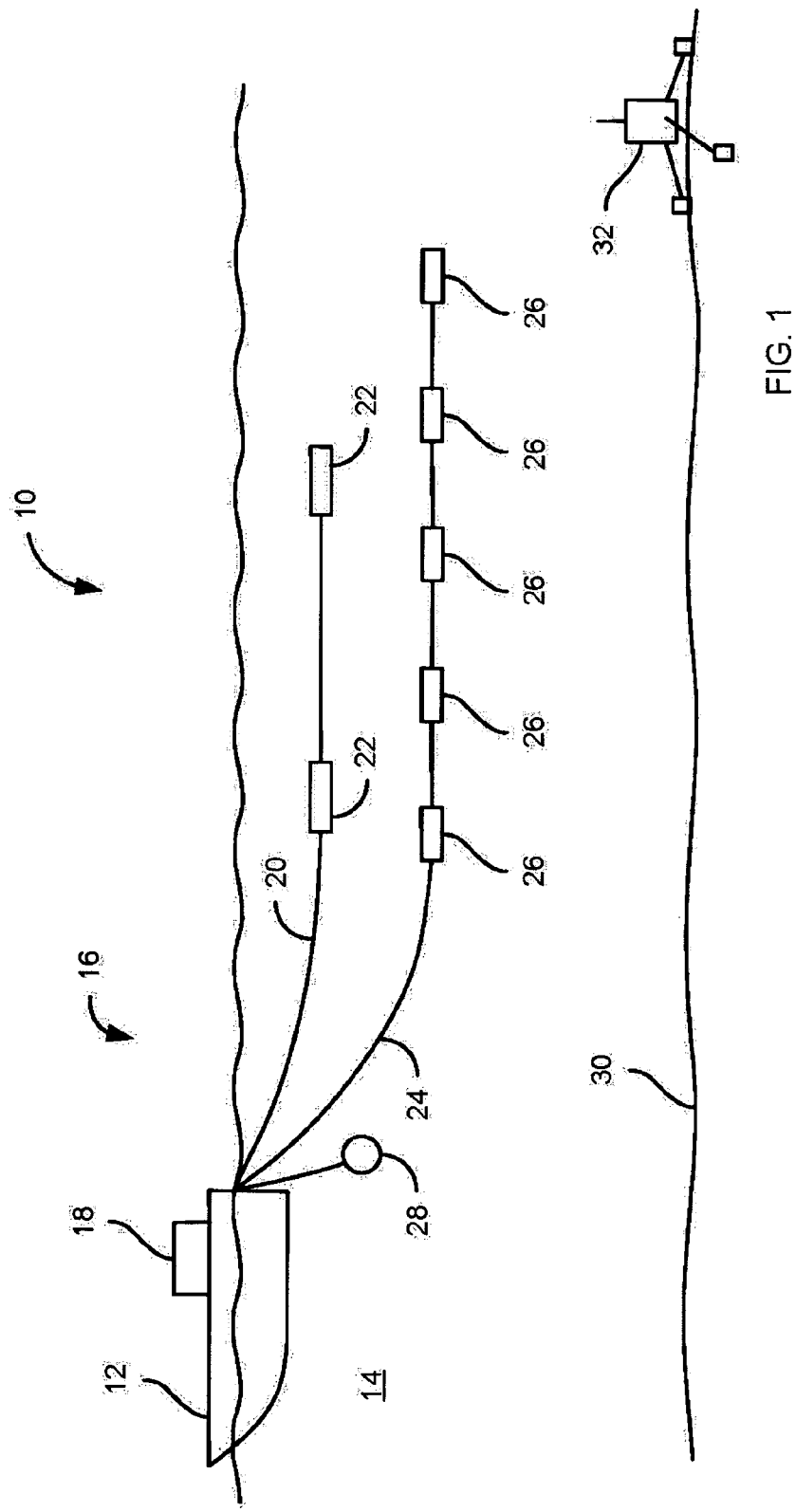
FIG. 1 shows one embodiment of a marine electromagnetic survey system performing a marine electromagnetic survey.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the appended claims.

DETAILED DESCRIPTION

Turning now to the figures, FIG. 1 shows one embodiment of a marine electromagnetic survey system 10 performing a marine electromagnetic survey. A survey vessel 12 is moving along the surface of a body of water 14, such as a lake or an ocean. A data acquisition system 16 of the survey system 10 includes a control system 18 aboard the survey vessel 12. The data acquisition system 16 also includes a source cable or streamer 20 being towed by the survey vessel 12.

In the embodiment of FIG. 1, the source streamer 20 includes a pair of spaced apart source electrodes 22 disposed along the source streamer 20. Electrical conductors within the source streamer 20 couple the control system 18 to the pair of source electrodes 22. The control system 18 includes equipment for applying electric voltage between the source electrodes 22 such that an electric current flows between the source electrodes 22. The source electrodes 22 couple the applied electrical energy into the water, thus acting as antennas. Other electromagnetic energy sources and wireless control systems are possible and contemplated.

The data acquisition system 16 also includes a sensor cable or streamer 24. In many embodiments, streamer 24 is also towed by the survey vessel 12, but it also may be towed by a second vessel (not shown). The streamer 24 includes multiple spaced apart sensor pods 26 disposed along the sensor streamer 24. Electrical conductors within the sensor streamer 24 couple the control system 18 to each of the sensor pods 26. The control system 18 also includes equipment for recording signals produced by sensors located within the sensor pods 26. Each of the sensor pods 26 includes electromagnetic sensor(s) and/or motion sensing unit(s).

At selected times, the control system 18 applies the electric voltage between the source electrodes 22 such that the electric current flows between the source electrodes 22. The resultant electromagnetic field propagates through the water 14 and into formations in the earth below a bottom surface 30. The electric current may be an alternating current at a single discrete frequency, or multiple frequencies as used in frequency domain electromagnetic surveying. The current may also be switched direct current, such used in transient controlled source electromagnetic surveying.

Each of the electromagnetic sensor(s) in the sensor pods 26 is adapted to measure a parameter of the electromagnetic field resulting from interaction of the electromagnetic field induced by the source electrodes 22 with subsurface formations in the earth below the bottom surface 30. The electromagnetic sensor(s) may be or include devices for detecting electric or magnetic fields about the electromagnetic sensor(s). For example, the electromagnetic sensor(s) may include pairs of receiver electrodes disposed at spaced apart positions along outer surfaces of the sensor pods 26 for detecting electric fields about the electromagnetic sensor(s). Alternatively, or in addition, the electromagnetic sensor(s) may be or include devices such as magnetometers for detecting magnetic fields about the electromagnetic sensor(s).

As the survey vessel 12 tows the sensor streamer 24 through the water 14, motion of the survey vessel 12, and of the sensor streamer 24, is not uniform. Such non-uniform motion results from currents in the water and changes in velocity (acceleration) of the survey vessel 12. As the sensor streamer 24 is being towed through the water 14, motion of components of the sensor streamer 24 in a magnetic field surrounding the sensor streamer 24 induces error voltage signals in electrical conductors carrying voltage output signals produced by the electromagnetic sensor(s) (and possibly in the electromagnetic sensor(s) themselves). As the motion of the components of the sensor streamer 24 are non-uniform, the induced error voltage signals vary with time.

As described in more detail below, the motion sensing unit(s) in the sensor pods 26 detect the motion of the sensor pods 26. Output signals produced by the motion sensing unit(s) are used to estimate the induced error voltage signals. The estimated induced error voltage signals are then used to correct the output signals produced by the electromagnetic sensor(s).

In some embodiments, the data acquisition system 16 of the survey system 10 may include one or more remote electromagnetic field sensor(s). One such remote electromagnetic field sensor 32 is positioned on the bottom surface 30 in FIG. 1. Output signal(s) produced by the electromagnetic field sensor 32 may be used to compensate, adjust, or correct the output signals produced by the electromagnetic sensor(s). One example of a magnetic field sensor that may be used is described in U.S. Pat. No. 6,842,006 issued to Conti et al. The magnetic field sensor 30 may include autonomous recording devices, or may include an electrical connection to a buoy at an upper surface of the water 14. The buoy may, for example, include wireless signal communication device(s) for communicating recorded data to the control system 18.

The survey vessel 12 may tow multiple sensor streamers 24. Each of the sensor streamers 24 may have multiple sections, and each section may have multiple sensor pods 26. In some embodiments, the survey vessel 12 may also tow a seismic energy source 28 such as an air gun or array of air guns. The sensor pods 26 may also include seismic sensors, such as hydrophones and/or geophones. The seismic energy source 28 may be actuated at selected times by the control system 18, and signals detected by the seismic sensors may be recorded by the recording equipment of the control system 18.

Figure 2:
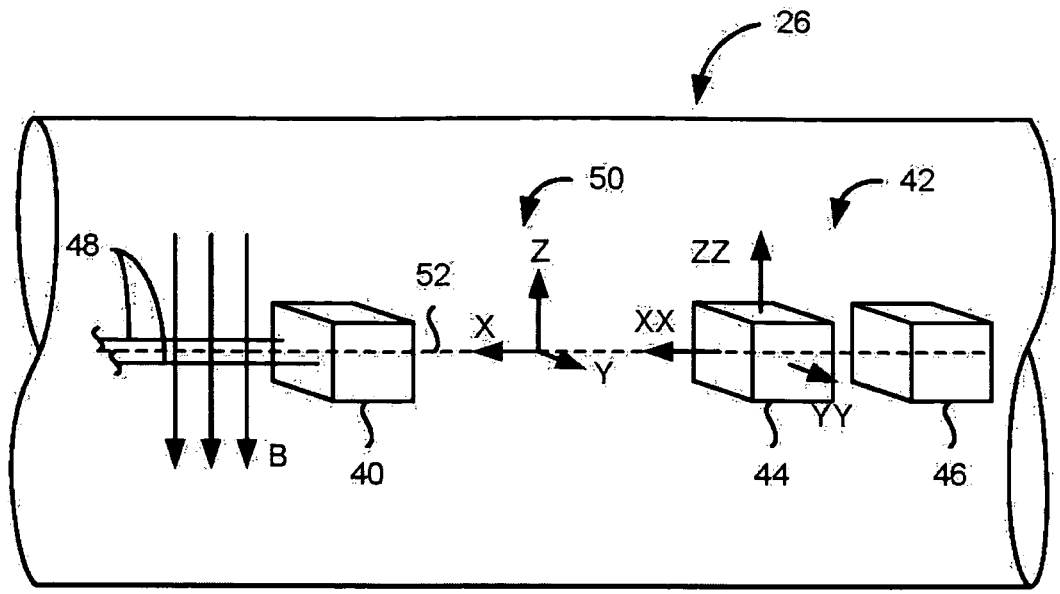
FIG. 2 is a side elevation view of one embodiment of one of multiple sensor pods of a sensor streamer of FIG. 1, where the sensor pod includes an electromagnetic sensor and a motion sensing unit.

FIG. 2 is a side elevation view of one embodiment of one of the sensor pods 26 of FIG. 1. In the embodiment of FIG. 2, the sensor pod 26 includes an electromagnetic sensor 40 and a motion sensing unit 42 positioned near the electromagnetic sensor 40. In other ones of the sensor pods 26, and in other embodiments, motion sensing units need not be positioned near electromagnetic sensors. For example, some streamer embodiments may employ only one motion sensing unit per streamer section (each streamer section having 20 or so electromagnetic sensor pods).

The electromagnetic sensor 40 is adapted to measure a parameter of the electromagnetic field resulting from interaction of the electromagnetic field induced by the source electrodes 22 with subsurface formations in the earth below the bottom surface 30 (see FIG. 1). The electromagnetic sensor 40 may be or include a device for detecting an electric field or a magnetic field about the electromagnetic sensor 40. For example, the electromagnetic sensor 40 may include a pair of receiver electrodes disposed at spaced apart positions along an outer surface of the sensor pod 26 for detecting an electric field about the electromagnetic sensor 40. Alternatively, or in addition, the electromagnetic sensor 40 may be or include a device such as a magnetometer for detecting a magnetic field about the electromagnetic sensor 40.

In some embodiments, a pair of electrical conductors 48 extends between sensor pods 26 and carries a voltage output signal produced by the electromagnetic sensor 40, thereby enabling multiple sensor signals to be combined or "grouped" before being digitized. As the sensor streamer 24 is being towed through the water 14 (see FIG. 1), motion of the electromagnetic sensor 40 and the electrical conductors 48 in a magnetic field B surrounding the sensor streamer 24 induces an error voltage signal between the electrodes of the electromagnetic sensor 40 and possibly in the electrical conductors 48 and/or in the electromagnetic sensor 40 itself.

Faraday's Law of Induction reveals that an induced electromotive force (voltage) occurs in an electrical conductor moving through a magnetic field and it is proportional to the velocity of the conductor and the strength of the magnetic field. As the sensor streamer 24 is towed through the water 14 (see FIG. 1), the sensor streamer 24 moves within the electromagnetic field produced by the source electrodes 22, and also moves within the earth's magnetic field. Motion of the sensor streamer 24 through the magnetic field induces noise voltages in the measurements of the electromagnetic sensor 40 and possibly on the signals carried by electrical conductors 48. These noise voltages, if large enough, can make it impracticable to produce an accurate measurement of the desired electromagnetic field.

In some embodiments, and as described in more detail below, output signals produced by the motion sensing unit 42 are recorded by equipment in the control system 18 (see FIG. 1). The recorded output signals produced by the motion sensing unit 42 are later reproduced, and used to estimate induced error voltage signals. These estimated induced error voltage signals are then used to correct the output signals produced by the electromagnetic sensor 40.

The motion sensing unit 42 is adapted to produce output signals indicative of motion of the sensor pod 26 with respect to a reference coordinate system 50 including orthogonal X, Y, and Z axes as indicated in FIG. 2. In the embodiment of FIG. 2, the motion sensing unit 42 includes a 3-axis accelerometer 44 and a rotation sensor 46. The 3-axis accelerometer 44 includes 3 separate accelerometers, each adapted to sense acceleration on one of 3 orthogonal axes shown in FIG. 2 and labeled 'XX,' 'YY,' and 'ZZ.' That is, the 3-axis accelerometer 44 includes an XX-axis accelerometer, a YY-axis accelerometer, and a ZZ-axis accelerometer. In FIG. 2, the sensor pod 26 is positioned such that the XX-axis of the 3-axis accelerometer 44 is aligned with the X axis of the reference coordinate system 50, the YY-axis of the 3-axis accelerometer 44 is aligned with the Y axis of the reference coordinate system 50, and the ZZ-axis of the 3-axis accelerometer 44 is aligned with the Z axis of the reference coordinate system 50.

Parameters of motion include acceleration, velocity, and displacement. As is common, acceleration measurements based on output signals of the accelerometers may be integrated with respect to time to obtain velocity measurements along the respective axes. The resultant velocity measurements may again be integrated with respect to time to obtain displacement measurements along the respective axes.

In the embodiment of FIG. 2, the electromagnetic sensor 40 and the motion sensing unit 42 are mounted within the sensor pod 26 such that the electromagnetic sensor 40 and the motion sensing unit 42 move with the sensor pod 26. In the embodiment of FIG. 2, the sensor pod 26 is substantially cylindrical in shape, and the electromagnetic sensor 40 and the motion sensing unit 42 are positioned on a central axis 52 of the sensor pod 26. As indicated in FIG. 2, the X axis of the reference coordinate system 50 extends along the central axis 52, and corresponds to a direction in which the sensor pod 26 is towed during use. The Z axis of the reference coordinate system 50 is directed vertically upward from the central axis 52 of the sensor pod 26.

FIG. 3 is a perspective view of one embodiment of the rotation sensor 46 of FIG. 2, where the rotation sensor 46 is a rotating coil magnetometer having four coils 60A-60D angularly displaced from one another by 45 degrees ($\pi/4$ radians) about a common axis 62. For simplicity, only the complete coil 60A and related components are shown in FIG. 3. In other embodiments, the rotation sensor 46 may include, for example, an inclinometer, a gyroscope, a magnetic compass, or any other type of device that can produce an output signal dependent upon an angle of rotation about an axis.

In the embodiment of FIG. 3, the coils 60A-60D are substantially identical and generally rectangular in shape. The coils 60A-60D are rotated about the common axis 62 at a substantially constant angular velocity '$\omega_M$' by an electric motor 64. The common axis 62 lies along the X axis of the reference coordinate system 50 of FIG. 2. Each of the coils 60A-60D has a selected number of turns of a conductor (e.g., wire) n, where n≥1. A magnetic field labeled "B" in FIG. 3 (including the earth's magnetic field) penetrating the rotating coils 60A-60D induces a voltage (or current) signal in each of the rotating coils 60A-60D.

In the embodiment of FIG. 3, each of the coils 60A-60D produces a voltage output signal between ends of the electrical conductors used to form the coils. A slip ring 66A is electrically connected to one end of an electrical conductor forming the coil 60A, and another slip ring 66B is electrically connected to the other end of the electrical conductor. Two brush contacts 68A and 68B in constant contact with the respective slip rings 66A and 66B as the coil 60A rotates, produce a voltage output signal. The other three coils 60B-60D have similar slip rings and brush contacts, and produce similar voltage output signals.

In the embodiment of FIG. 3, the rotation sensor 46, a rotating coil magnetometer, includes a mounting bracket 70 for mounting the rotation sensor 46 in the sensor pod 26 of FIG. 2. The mounting bracket may be fabricated from, for example, a rigid plastic material. Suitable rigid plastic materials include ISOPLAST 202EZ (Dow Chemical Co.), a urethane plastic material that is highly dimensionally stable, extremely tough, and is resistant to many chemicals.

Figure 4:
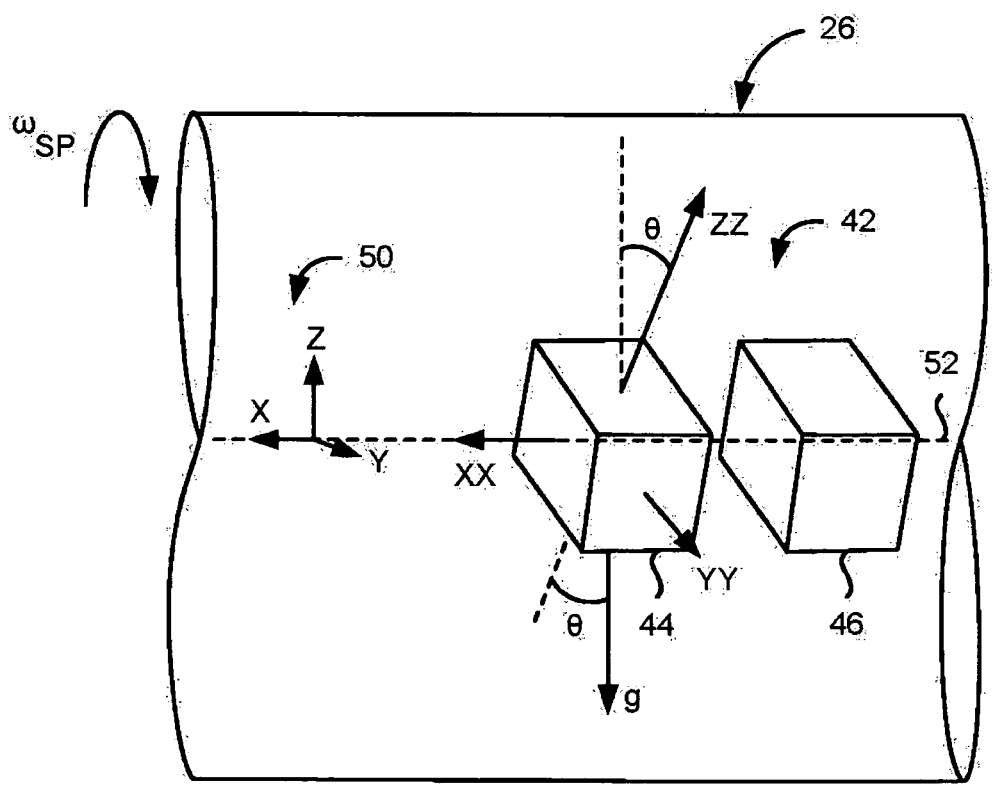
FIG. 4 which shows a portion of the sensor pod of FIG. 2 about the motion sensing unit, where the sensor pod has rotated an angle θ about a central axis.

Referring back to FIGS. 1 and 2, while the sensor streamer 24 is being towed through the water 14 (see FIG. 1), the sensor pods 26 will expectedly rock back and forth about their central axes. In FIG. 2, the sensor pod 26 expectedly rocks back and forth about the central axis 52. This situation is depicted in FIG. 4 which shows a portion of the sensor pod 26 of FIG. 2 about the motion sensing unit 42, where the sensor pod 26 has rotated an angle $\theta$ about the central axis 52. An angular velocity '$\omega_{SP}$' of the sensor pod 26 about the central axis 52 expectedly varies continuously, alternating between positive and negative values as the sensor pod 26 rocks back and forth.

This back-and-forth motion of the sensor pod 26 about the central axis 52 expectedly causes gravity to affect the accelerometer measurements in a varying fashion. As indicated in FIG. 4, with the sensor pod 26 rotated the angle $\theta$ about the central axis 52, the XX sensing axis of the 3-axis accelerometer 44 remains aligned with the X axis of the reference coordinate system 50. The YY and ZZ sensing axes of the 3-axis accelerometer 44 have rotated the angle $\theta$ about the central axis 52.

Referring to FIGS. 3 and 4, the common axis 62 of the rotation sensor 46 and the central axis 52 of the sensor pod 26 are coincident. An angular velocity '$\omega_C$' at which the coils 60A-60D of the rotation sensor 46 rotate about the common axis 62 is given by: $\omega_C=\omega_M+\omega_{SP}$, where $\omega_M$ is the (substantially constant) angular velocity that the electric motor 64 rotates the coils 60A-60D about the common axis 62, and $\omega_{SP}$ is the (variable) angular velocity at which the sensor pod 26 rotates about the central axis 52.

Figure 5A:
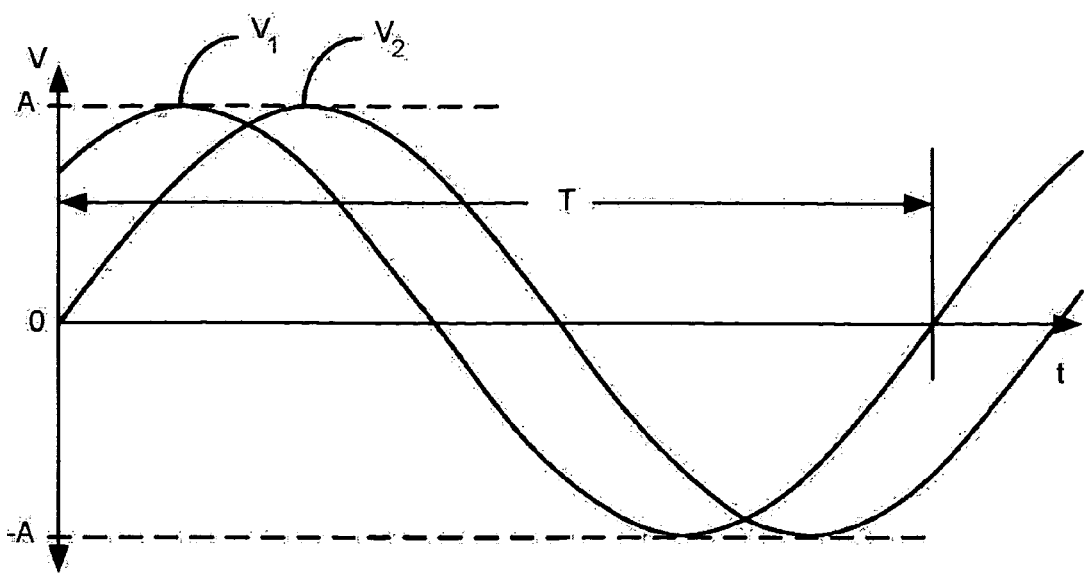
FIG. 5A shows expected sine wave voltage output signals produced by two different coils of the rotation sensor of FIG. 3 in a constant magnetic field.

When coils 60A-60D rotate in a constant magnetic field B, they produce sine wave output voltage signals. FIG. 5A shows an expected sine wave voltage output signal '$V_1$' produced by the coil 60A of the rotation sensor 46 of FIG. 3, and an expected sine wave voltage output signal '$V_2$' produced by the coil 60B. In the graph of FIG. 5A, the horizontal axis is time 't,' and the vertical axis is volts 'V.' The sine wave voltage output signal $V_1$ produced by the coil 60A is given by: $V_1=nBA\omega_C \sin(\omega_C t)$, where n is the number or windings or turns in the coil 60A, B is the magnitude of the magnetic field in FIG. 3, 'A' is an enclosed area of the coil 60A, and $\omega_C$ is the angular velocity at which the coil 60A rotates about the common axis 62 (see FIG. 3). The coil 60B is angularly displaced from the coil 60A by 45° ($\pi/4$ radians), and the sine wave voltage output signal V2 produced by the coil 60B is given by: $V_2=nBA\omega_C \sin(\omega_C t+\pi/4)$.

In FIG. 5A, the amplitudes of the sine wave voltage output signals $V_1$ and $V_2$ are both 'A' where A=$nBA\omega_C$, and the periods of the sine wave voltage output signals $V_1$ and $V_2$ are 'T' where T=$(2\pi/\omega_C)$ with $\omega_C$ in radians per second. The frequencies of the sine wave voltage output signals $V_1$ and $V_2$ are 'f' where f=$1/T=(\omega_C/2\pi)$ with $\omega_C$ in radians per second. It is noted that the frequencies and the amplitudes of the sine wave voltage output signals $V_1$ and $V_2$ depend on $\omega_C$, where $\omega_C=\omega_M+\omega_{SP}$. When $\omega_{SP}=0$ such that $\omega_C=\omega_M$ where $\omega_M$ is substantially constant, the coils 60A-60D produce sine wave output voltage signals having substantially constant periods, frequencies, and amplitudes.

Figure 5B:
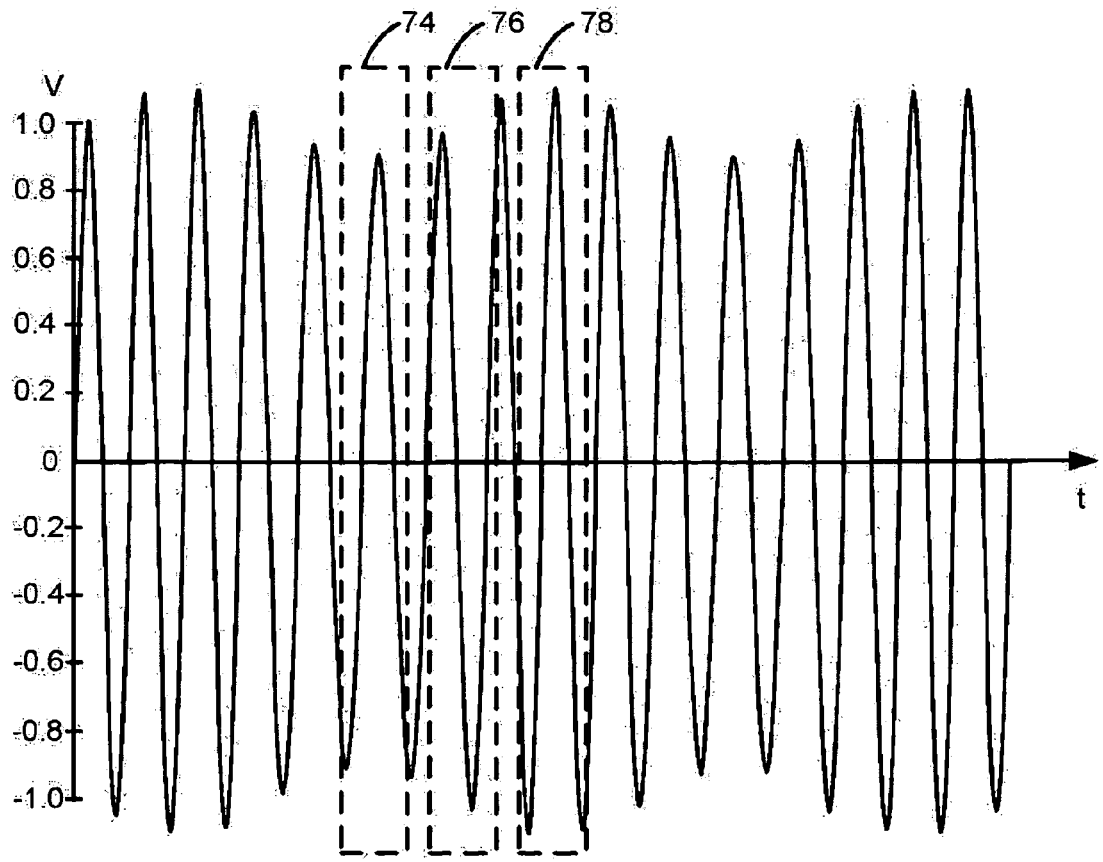
FIG. 5B shows an expected sine wave voltage output signal produced by one of the coils of the rotation sensor of FIG. 3 as the sensor pod of FIG. 2 rocks back and forth about the central axis while being towed through water.

FIG. 5B shows an expected sine wave voltage output signal produced by one of the coils 60A-60D of the rotation sensor 46 of FIG. 3 as the sensor pod 26 of FIG. 2 rocks back and forth about the central axis 52 (i.e., about the X axis of the reference coordinate system 50) while being towed through water (e.g., the water 14 of FIG. 1). In the graph of FIG. 5B, the horizontal axis is time 't,' and the vertical axis is volts 'V.' As described above, $\omega_C=\omega_M+\omega_{SP}$, the amplitude A of the sine wave voltage output signal is given by: A=$nBA\omega_C$, and the frequency f of the sine wave voltage output signal is given by: f=$(\omega_C/2\pi)$, where $\omega_C$ is in radians per second.

When a direction of $\omega_M$ is assumed to be positive, and $\omega_{SP}$ is in the direction of $\omega_M$, $\omega_C>\omega_M$, and both the frequency and the amplitude of the voltage output signal are greater than when $\omega_C=\omega_M$. When $\omega_{SP}$ is in a direction opposite that of $\omega_M$, $\omega_C<\omega_M$, and both and the amplitude of the voltage output signal are smaller than when $\omega_C=\omega_M$. Thus at times within a portion 74 of the graph, $\omega_{SP}$ is in the direction opposite that of $\omega_M$, and at times within a portion 78 of the graph, $\omega_{SP}$ is in the direction of $\omega_M$. At some point within a portion 76 of the graph, $\omega_{SP}=0$ and $\omega_C=\omega_M$.

Referring back to FIG. 4, the sensor pod 26 has rotated the angle $\theta$ about the X axis of the reference coordinate system 50. The XX-axis accelerometer of the 3-axis accelerometer 44 measures an acceleration '$a_{XX}$,' where the measurement includes a noise component '$n_X$.' The YY-axis accelerometer of the 3-axis accelerometer 44 measures an acceleration '$a_{YY}$' including a noise component '$n_Y$,' and the ZZ-axis accelerometer of the 3-axis accelerometer 44 measures an acceleration '$a_{ZZ}$' including a noise component '$n_Z$.' These measurements can be expressed in terms of the true acceleration in the reference coordinate system: $a_{XX}=a_X+n_X$, $a_{YY}=a_Y\cos\theta+(a_Z-g)\sin\theta+n_Y$, and $a_{ZZ}=-a_Y\sin\theta+(a_Z-g)\cos\theta+n_Z$, where 'g' is the acceleration due to gravity. In matrix notation:

$$[a_{XX}, a_{YY}, a_{ZZ}] = [a_X, a_Y, (a_Z-g)]\begin{vmatrix} 1 & 0 & 0 \\ 0 & \cos\theta & -\sin\theta \\ 0 & \sin\theta & \cos\theta \end{vmatrix} + [n_X, n_Y, n_Z]$$

Figure 6:
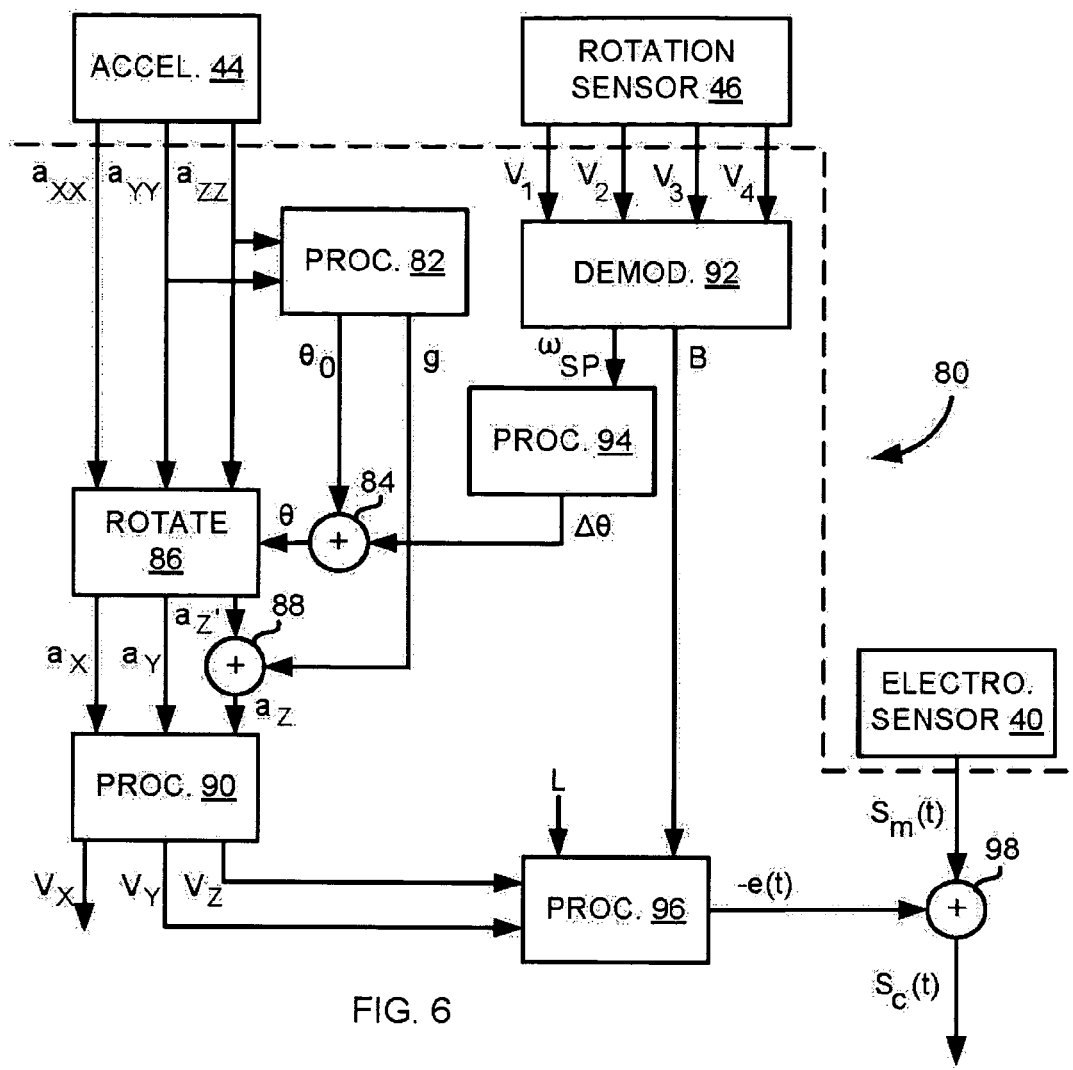
FIG. 6 is a diagram of one embodiment of a signal processing system for correcting an output signal produced by the electromagnetic sensor of the sensor pod FIG. 2.

FIG. 6 is a diagram of one embodiment of a signal processing system 80 for correcting the output signal produced by the electromagnetic sensor 40 of FIG. 2. The system 80 uses the output signals of the motion sensing unit 42 of FIG. 2 to estimate an induced error voltage signal, and subtracts the estimated induced error voltage signal from the output signal of the electromagnetic sensor 40 to produce a corrected output signal. During operation of the system 80, the $a_{YY}$ and $a_{ZZ}$ output signals produced by the 3-axis accelerometer 44 are provided to a processing unit 82. The processing unit 82 uses the $a_{YY}$ and $a_{ZZ}$ output signals to produce a '$\theta_0$' signal indicative of a long term value of the angle $\theta$ in FIG. 4, and a 'g' signal indicative of the acceleration due to gravity g.

In some embodiments, the processing unit 82 produces a long term average of the $a_{YY}$ signal '$\overline{a_{YY}}$' and a long term average of the $a_{ZZ}$ signal '$\overline{a_{ZZ}}$.' The time periods over which the $\overline{a_{YY}}$ and $\overline{a_{ZZ}}$ signals are formed may be, for example, from 2 to 10 minutes. The $\overline{a_{YY}}$ and $\overline{a_{ZZ}}$ signals may be formed using analog or digital circuits, signals, and methods, or combinations thereof. In some embodiments, the processing unit 82 produces the $\theta_0$ signal according to: $\theta_0=\arctan(\overline{a_{YY}}/\overline{a_{ZZ}})$, and produces the g signal according to: $g=\sqrt{(\overline{a_{YY}})^2+(\overline{a_{ZZ}})^2}$.

A summer 84 of the system 80 receives the $\theta_0$ signal produced by the processing unit 82, and a '$\Delta\theta$' signal indicative of an angle of rotation with respect to $\theta_0$, and produces an output '$\theta$' signal according to: $\theta=\theta_0+\Delta\theta$. The $\theta$ signal is indicative of an angular rotation of the motion sensing unit 42 about the X axis of the reference coordinate system 50 (see FIG. 4). A rotate unit 86 receives the $a_{XX}$, $a_{YY}$, and $a_{ZZ}$ signals from the 3-axis accelerometer 44, and the $\theta$ signal from the summer 84, and produces $a_X$, $a_Y$, and $a_Z'$ signals according to:

$$[a_X, a_Y, a_Z'] = [a_{XX}, a_{YY}, a_{ZZ}]\begin{vmatrix} 1 & 0 & 0 \\ 0 & \cos\theta & \sin\theta \\ 0 & -\sin\theta & \cos\theta \end{vmatrix}$$

The $a_X$, $a_Y$, and $a_Z'$ signals are indicative of accelerations in the X, Y, and Z directions, respectively, defined by the reference coordinate system 50 of FIG. 2. A summer 88 of the system 80 receives the $a_Z'$ signal produced by the rotation unit 86 and the g signal produced by the processing unit 82, and produces an true vertical acceleration $a_Z$ signal according to: $a_Z=a_Z'+g$. A processing unit 90 of the system 80 receives the $a_X$, $a_Y$, and $a_Z$ signals, and produces output signals '$V_X$,' '$V_Y$,' and '$V_Z$' according to: $V_X=\int a_X \cdot dt$, $V_Y=\int a_Y \cdot dt$, and $V_Z=\int a_Z \cdot dt$. The $V_X$, $V_Y$, and $V_Z$ signals are indicative of velocities of the sensor pod 26 of FIG. 2 along the X, Y, and Z axes, respectively, and of velocities of all components mounted within the sensor pod 26.

In the embodiment of FIG. 6, the rotation sensor 46 of FIG. 2 includes the rotating coil magnetometer of FIG. 3. The four rotating coils 60A-60D produce the voltage output signals $V_1$ and $V_2$ described above, along with voltage output signals '$V_3$' and '$V_4$.' A demodulator 92 receives the output voltage signals $V_1$-$V_4$ and uses the voltage output signals $V_1$-$V_4$ to produce a '$\omega_{SP}$' signal indicative of the angular velocity $\omega_{SP}$ of the sensor pod 26 of FIG. 2 (and all components mounted within the sensor pod 26), and a 'B' signal indicative of the magnitude of the magnetic field B about the rotation sensor 46 of FIG. 3. The demodulator 92 produces the $\omega_{SP}$ signal according to: $\omega_{SP}=\omega(V_X)-\omega_M$, where $\omega(V_X)$ is the frequency of a selected one of the received output signals $V_X$ in radians per second, where X=1, 2, 3, or 4, and $\omega_M$ is the angular velocity (in radians per second) at which the electric motor 64 rotates the coils 60A-60D (see FIG. 3). The demodulator 92 produces the B signal according to: $B=(\text{amplitude of }V_X)/\{nA[\omega(V_X)]\}$, where n is the number or windings or turns in the coil producing the voltage output signal $V_X$, and A is the enclosed area of the coil producing the voltage output signal $V_X$ (see FIG. 3).

A processing unit 94 of the system 80 receives the $\omega_{SP}$ signal produced by the demodulator 92, and produces the $\Delta\theta$ signal according to: $\Delta\theta=\omega \cdot dt$. A processing unit 96 of the system 80 receives the $V_Y$ and $V_Z$ signals produced by the processing unit 90, an 'L' signal indicative of a length of conductors 48 in the X direction defined by the reference coordinate system 50 (see FIG. 2) between the electromagnetic sensor 40 and the control system 18 of FIG. 1, and the B signal produced by the demodulator 92. The processing unit 96 uses the $V_Y$, $V_Z$, L, and B signals to produce an error signal 'e(t)' according to: $e(t)=BL\sqrt{(V_Y)^2+(V_Z)^2}$. The error signal e(t) is indicative of an estimate of the noise voltage introduced into conductors by the motion of the conductors and the sensor pods 26 in the Y and Z directions (i.e., along the Y and Z axes of the reference coordinate system 50). The processing unit 96 determines a sign of the error signal e(t) dependent upon the direction of B, the motion of the conductors, and the assigned polarity of the sensing electrodes (e.g., according to the right-hand rule).

In the embodiment of FIG. 6, the processing unit 96 inverts the sign of the error signal e(t) so that when the error signal e(t) is subsequently added to the output voltage signal of the electromagnetic sensor 40, the error signal e(t) is subtracted from the output voltage signal. The processing unit 96 thus produces an output signal '−e(t)' as indicated in FIG. 6.

In the embodiment of FIG. 6, the electromagnetic sensor 40 produces an output voltage signal '$s_m(t)$.' A summer 98 of the system 80 receives the output signal $s_m(t)$ and the error signal e(t), and produces a corrected output signal '$s_c(t)$' according to: $s_c(t)=s_m(t)+[-e(t)]$. As the sign of the error signal e(t) was previously inverted, the error signal e(t) is subtracted from the output signal $s_m(t)$ to produce the corrected output signal $s_c(t)$.

It is noted that the signal processing system 80 of FIG. 6 may use analog and/or digital circuits, signals, and signal processing techniques to correct the output signal produced by the electromagnetic sensor 40 of FIG. 2. That is, the rotate unit 86, the demodulator 92, the processing units 82, 90, 94, and 96, and/or the summers 84, 88, and 98 of the signal processing system 80 of FIG. 6 may use analog and/or digital circuits, firmware, and signals in accordance with established signal processing techniques.

In some embodiments, the signal processing system 80 of FIG. 6 may be located in the sensor pod 26 of FIG. 2. Alternatively, the system 80 may be located in other parts of the sensor streamer 24 of FIG. 1, in the control system 18 of FIG. 1, or in a remote location. The signals produced by the 3-axis accelerometer 44, and rotation sensor 46, and the electromagnetic sensor 40 may be applied directly to the system 80, or the signals produced by the 3-axis accelerometer 44, and rotation sensor 46, and the electromagnetic sensor 40 may be recorded, reproduced at a later time, and applied to the system 80.

Figure 7:
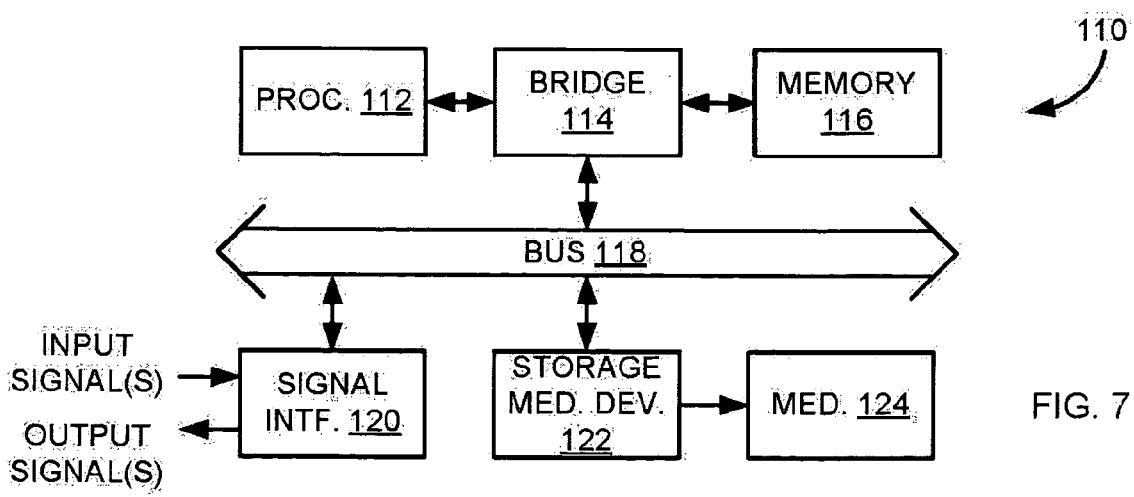
FIG. 7 is a diagram of one embodiment of a computer system capable of carrying out some or all of the functions of the components of the signal processing system of FIG. 6.

FIG. 7 is a diagram of one embodiment of a computer system 110 capable of carrying out some or all of the functions of the components of the signal processing system 80 of FIG. 6. In the embodiment of FIG. 7, the computer system 110 includes one or more processor(s) 112, a bridge 114, a memory 116, a bus 118, a signal interface unit 120, a storage device 122, and a storage medium 124. The bridge 114 is connected to the processor(s) 112, the memory 116, and the bus 118. The bridge 114 handles communication between the processor(s) 112 and the memory 116, the signal interface unit 120, and the storage device 122, and between the memory 116 and the signal interface unit 120 and the storage device 122.

The signal interface unit 120 is adapted to receive input signals, and to produce output signals. The signal interface unit 120 is controlled by the processor(s) 112. The input and output signals may be analog and/or digital. The signal interface unit 120 may include, for example, an analog-to-digital converter, and/or a digital-to-analog converter.

The storage device 122 is adapted to send information to, and receive information from, the storage medium 124. For example, the storage device 122 may be adapted to write information to, and read information from, the storage medium 124. The storage medium device may be, for example, a magnetic or optical disk drive device, or a port such as a universal serial bus (USB) port. The storage medium 124 may be, for example, a nonvolatile memory device such as a magnetic disk, an optical disk such as a Compact Disc Read Only Memory (CD-ROM) disk or a Digital Versatile Disc (DVD) disk, a flash memory device such as a USB flash drive, or a portable hard drive.

Software including processor instructions for carrying out the functions of the rotate unit 86, the demodulator 92, the processing units 82, 90, 94, and 96, and/or the summers 84, 88, and 98 of the signal processing system 80 of FIG. 6 may, for example, be stored in the memory 116. The processor(s) 112 may fetch the instructions from the memory 116 and execute the instructions, thus carrying out the functions of the units.

In the embodiment of FIG. 2, the motion sensing unit 42 is positioned near the electromagnetic sensor 40. The other sensor pods 26 of the survey system 10 of FIG. 1 may include motion sensing units and/or electromagnetic sensors, where the motion sensing units need not be positioned near electromagnetic sensors. For example, in the survey system of FIG. 1, the survey vessel 12 may tow multiple sensor streamers 24 as described above. Each of the sensor streamers 24 may have multiple sections, and each section may have multiple sensor pods 26. In some embodiments there may be only one motion sensor unit per streamer section, either in a separate sensor pod or included in a sensor pod 26. Velocity signals for electromagnetic sensors may be generated by interpolating between velocity signals produced by the motion sensing units.

Figure 8:
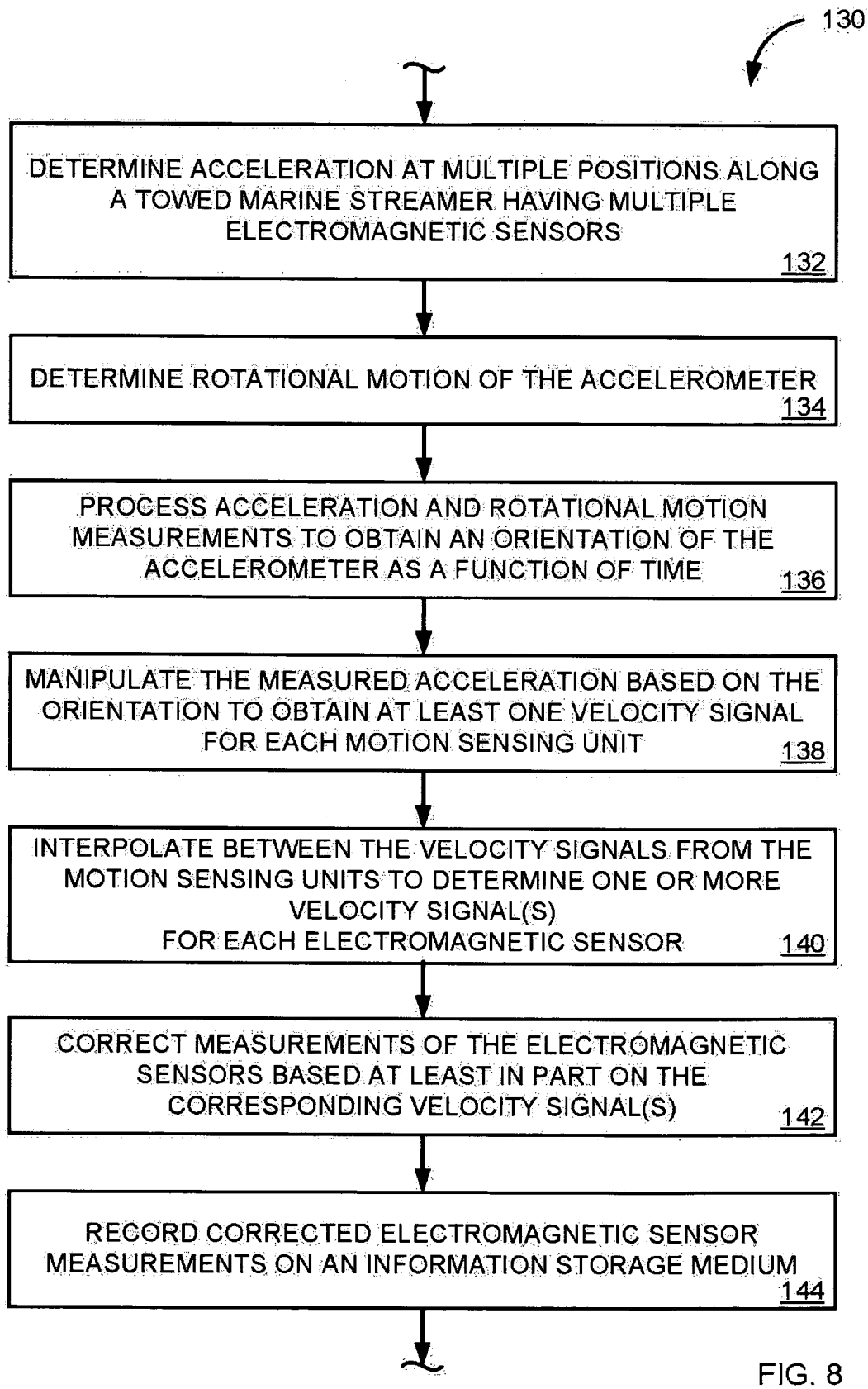
FIG. 8 is a flowchart of one embodiment of a method for performing an electromagnetic survey.

FIG. 8 is a flowchart of one embodiment of a method 130 for performing an electromagnetic survey. A first block 132 of the method 130 includes measuring acceleration at multiple positions along a towed marine streamer (e.g., the sensor streamer 24 of FIG. 1), where the streamer has multiple electromagnetic sensors (e.g., the electromagnetic sensor 40 of FIG. 2. In a second block 134, a rotating coil magnetometer (e.g., the rotating coil magnetometer of FIG. 3) is used to determine rotational motion of each motion sensing unit used to measure the acceleration (e.g., the motion sensing unit 42 of FIG. 2).

The acceleration and rotational motion measurements are processed to obtain an orientation of each motion sensing unit as a function of time in a block 136. For example, in the signal processing system 80 of FIG. 6, the $\theta_0$ signal indicative of a indicative of a long term baseline value of the angle $\theta$ in FIG. 4, and the $\Delta\theta$ signal indicative of an angle of rotation with respect to $\theta_0$, are used to produce the $\theta$ signal indicative of an angular position of the motion sensing unit 42 about the X axis of the reference coordinate system 50 (see FIG. 4).

In a block 138, the measured acceleration is manipulated based on the orientation to obtain at least one velocity signal for each motion sensing unit. In the signal processing system 80 of FIG. 6, $a_{XX}$, $a_{YY}$, and $a_{ZZ}$ signals from the 3-axis accelerometer 44, and the $\theta$ signal, are to produce the $a_X$, $a_Y$, and $a_Z$ signals indicative of accelerations of the motion sensing unit 42 of FIGS. 2 and 4 (and the electromagnetic sensor 40 near the motion sensing unit 42) in the X, Y, and Z directions, respectively. The $a_X$, $a_Y$, and $a_Z$ signals are in turn used to generate the $V_X$, $V_Y$, and $V_Z$ signals indicative of the velocities of the motion sensing unit 42 (and the electromagnetic sensor 40 near the motion sensing unit 42) along the X, Y, and Z axes, respectively.

One or more velocity signal(s) are determined for each electromagnetic sensor by interpolating velocity signals between the motion sensing units in a block 140. As described above, motion sensing units need not be positioned near electromagnetic sensors. Velocity signals for each electromagnetic sensor may be generated by interpolating between velocity signals produced by multiple motion sensing units.

In a block 142, the measurements of the electromagnetic sensors are corrected based at least in part on the corresponding velocity signal(s). In the signal processing system 80 of FIG. 6, the output signal $s_m(t)$ produced by the electromagnetic sensor 40 is corrected by subtracting the estimated error signal e(t) from the output signal $s_m(t)$, thereby producing the corrected output signal $s_c(t)$. The corrected electromagnetic sensor measurements are recorded on an information storage medium (e.g., the storage medium 124 of FIG. 7) in a block 144.

Numerous variations and modifications will become apparent to those skilled in the art once the above disclosure is fully appreciated. It is intended that the following claims be interpreted to embrace all such variations and modifications.

What is claimed is:

1. An electromagnetic survey system with motion-induced noise voltage compensation comprising:
 a pair of source electrodes with electric voltage applied between them;
 a towed streamer with an electromagnetic sensor pod that includes an electromagnetic sensor to detect an electromagnetic field parameter and to output a corresponding voltage signal indicative of an electromagnetic sensor measurement;
 a motion sensing unit associated with the electromagnetic sensor, wherein the motion sensing unit comprises,
  an accelerometer to measure acceleration motion perpendicular to an axis of said streamer; and
  a rotation sensor to measure rotational motion about said axis; and
 at least one processor that determines for the electromagnetic sensor:

a motion signal as a function of time based at least in part on measured acceleration motion perpendicular to the axis and measured rotational motion about the axis, and a corrected electromagnetic sensor measurement from at least the voltage signal and the motion signal, wherein the corrected electromagnetic sensor measurement represents removal of an estimated motion-induced noise voltage from the voltage signal.

2. The system of claim 1, wherein the measured acceleration motion is used to determine velocity of the electromagnetic sensor perpendicular to said axis.

3. The system of claim 1, wherein the electromagnetic sensor pod includes the motion sensing unit.

4. The system of claim 1, wherein said at least one processor determines a velocity of the electromagnetic sensor perpendicular to said axis by interpolating between measurements gathered from a plurality of motion sensing units.

5. The system of claim 1, further comprising an information storage medium that stores measurements of the electromagnetic sensor and the motion sensing unit.

6. The system of claim 5, wherein the information storage medium also stores corrected electromagnetic sensor measurements.

7. The system of claim 1, wherein the rotation sensor comprises a rotating coil magnetometer.

8. The system of claim 7, wherein the rotating coil magnetometer has multiple windings to provide multiple signals that are at different phase offsets from one another.

9. The system of claim 1, wherein the rotation sensor comprises a sensor from the group consisting of: an inclinometer, a gyroscope, and a magnetic compass.

10. The system of claim 1, wherein the motion sensing unit determines a base orientation from measurements of said accelerometer, and further determines a current orientation by combining the base orientation with a processed angular velocity signal from said rotation sensor.

11. The system of claim 10, wherein the motion sensing unit rotates the accelerometer measurements to an external reference frame based on the current orientation, and wherein the motion sensing unit further corrects the rotated measurements for gravity.

12. An electromagnetic survey method with motion-induced noise voltage compensation comprising:
applying an electric voltage between source electrodes;
measuring acceleration motion perpendicular to an axis of a towed marine streamer, said streamer having an electromagnetic sensor;
measuring rotational motion about the axis;
determining a motion signal of the electromagnetic sensor as a function of time using the measured acceleration motion perpendicular to the axis and the measured rotational motion about the axis;
detecting an electromagnetic field parameter with the electromagnetic sensor and outputting a corresponding voltage signal indicative of an electromagnetic sensor measurement; and
determining a corrected electromagnetic sensor measurement from at least the voltage signal and the motion signal, wherein the corrected electromagnetic sensor measurement represents removal of an estimated motion-induced noise voltage from the voltage signal.

13. The method of claim 12, wherein said corrected electromagnetic field measurement is further based on a magnetic field strength measured by a rotating coil magnetometer.

14. The method of claim 12, further comprising:
using a motion sensing unit to measure the acceleration motion and the rotational motion;
processing the acceleration motion measurements and the rotational motion measurements to obtain an orientation of the motion sensing unit as a function of time; and
manipulating the measured acceleration motion based on the orientation to obtain a velocity signal for the motion sensing unit, wherein said manipulating includes:
rotating multi-axial accelerometer measurements from a coordinate system of the motion sensing unit to an external coordinate system, and
subtracting gravity from a vertical component of the rotated measurements to obtain estimated acceleration components.

15. The method of claim 14, wherein said manipulating further includes processing the estimated acceleration components to obtain velocity component signals perpendicular to an axis of the towed marine streamer, wherein the corrected electromagnetic sensor measurement is based on said velocity component signals.

16. The method of claim 12, further comprising determining velocity of the electromagnetic sensor relative to said axis based on the measured acceleration motion and the measured rotational motion, and using the determined velocity for said determining the corrected electromagnetic sensor measurement.

17. The method of claim 16, further comprising measuring acceleration motion perpendicular to said axis at multiple points along the towed streamer, wherein said determining velocity of the electromagnetic sensor is based on at least some of the measured acceleration motions.

18. The method of claim 16, further comprising measuring rotational motion perpendicular to said axis at multiple points along the towed streamer, wherein said determining velocity of the electromagnetic sensor is based on at least some of the measured rotational motions.

19. A motion sensing system for a towed marine streamer with motion-induced noise voltage compensation, the system comprising:
a motion sensing unit; and
a signal processor,
wherein the motion sensing unit includes,
a tri-axial accelerometer positioned on a streamer axis, with one component of the accelerometer aligned along said axis, and
a magnetometer having at least one coil that rotates about an axis of symmetry contained in a plane that includes said coil, said axis being aligned along the streamer axis,
wherein the signal processor demodulates a signal from the magnetometer to determine a magnetic field strength and an angular velocity signal representing rotational motion of the motion sensing unit about the streamer axis,
wherein the signal processor combines accelerometer measurements with the magnetometer measurements to produce output signals representing components of the unit's motion in an external frame of reference,
wherein the output signals are used to determine for an electromagnetic sensor a motion signal as a function of time, and wherein a corrected measurement for the electromagnetic sensor is determined by removing a motion-induced noise voltage estimated using the motion signal from a voltage signal output from the electromagnetic sensor in response to an electric voltage applied between source electrodes.

20. The system of claim 19, wherein the external frame of reference is defined by a three-axis coordinate system having one axis aligned with the streamer axis, one axis aligned with gravity, and the third axis perpendicular to the first two.

21. The system of claim 19, wherein the output signals represent acceleration components.

22. The system of claim 19, wherein the output signals represent velocity components.

* * * * *